US012586906B2

(12) United States Patent
Yao et al.

(10) Patent No.: US 12,586,906 B2
(45) Date of Patent: Mar. 24, 2026

(54) ANTENNA PACKAGE USING BALL ATTACH ARRAY TO CONNECT ANTENNA AND BASE SUBSTRATES

(71) Applicant: Intel Corporation, Santa Clara, CA (US)

(72) Inventors: Jimin Yao, Chandler, AZ (US); Robert L. Sankman, Phoenix, AZ (US); Shawna M. Liff, Scottsdale, AZ (US); Sri Chaitra Jyotsna Chavali, Chandler, AZ (US); William J. Lambert, Chandler, AZ (US); Zhichao Zhang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 176 days.

(21) Appl. No.: 18/498,411

(22) Filed: Oct. 31, 2023

(65) Prior Publication Data

US 2024/0063544 A1 Feb. 22, 2024

Related U.S. Application Data

(60) Division of application No. 17/705,182, filed on Mar. 25, 2022, now Pat. No. 11,870,163, which is a (Continued)

(51) Int. Cl.
*H01Q 9/04* (2006.01)
*H01L 21/48* (2006.01)
(Continued)

(52) U.S. Cl.
CPC ....... *H01Q 9/0414* (2013.01); *H01L 21/4853* (2013.01); *H01L 21/4857* (2013.01);
(Continued)

(58) Field of Classification Search
CPC .. H01Q 9/0414; H01Q 1/523; H01Q 21/0087; H01Q 21/065; H01Q 1/2283;
(Continued)

(56) References Cited

U.S. PATENT DOCUMENTS

| | | | |
|---|---|---|---|
| 11,424,195 B2 * | 8/2022 | Shaul | H01L 23/5389 |
| 2008/0157341 A1 * | 7/2008 | Yang | H01L 23/467 |
| | | | 257/E21.507 |

(Continued)

FOREIGN PATENT DOCUMENTS

| | | |
|---|---|---|
| CN | 101411077 A | 4/2009 |
| CN | 103400829 A | 11/2013 |

(Continued)

*Primary Examiner* — Seung H Lee
(74) *Attorney, Agent, or Firm* — Akona IP PC

(57) ABSTRACT

In accordance with disclosed embodiments, there is an antenna package using a ball attach array to connect an antenna and base substrates of the package. One example is an RF module package including an RF antenna package having a stack material in between a top and a bottom antenna layer to form multiple antenna plane surfaces, a base package having alternating patterned conductive and dielectric layers to form routing through the base package, and a bond between a bottom surface of the antenna package and to a top surface of the base package.

20 Claims, 8 Drawing Sheets

Related U.S. Application Data continuation of application No. 16/635,148, filed as application No. PCT/US2017/054395 on Sep. 29, 2017, now Pat. No. 11,355,849.

(51) Int. Cl.

| | |
|---|---|
| *H01L 21/56* | (2006.01) |
| *H01L 23/498* | (2006.01) |
| *H01L 23/66* | (2006.01) |

(52) U.S. Cl.
CPC ...... *H01L 21/563* (2013.01); *H01L 23/49816* (2013.01); *H01L 23/49822* (2013.01); *H01L 23/49838* (2013.01); *H01L 23/66* (2013.01); *H01L 2223/6616* (2013.01); *H01L 2223/6677* (2013.01)

(58) Field of Classification Search
CPC ............. H01L 21/4853; H01L 21/4857; H01L 21/563; H01L 23/49816; H01L 23/49822; H01L 23/49838; H01L 23/66; H01L 2223/6616; H01L 2223/6677
See application file for complete search history.

(56) References Cited

U.S. PATENT DOCUMENTS

| | | | |
|---|---|---|---|
| 2010/0309071 | A1 | 12/2010 | Rofougaran |
| 2010/0327068 | A1 | 12/2010 | Chen et al. |
| 2013/0207274 | A1 | 8/2013 | Liu et al. |

FOREIGN PATENT DOCUMENTS

| | | | |
|---|---|---|---|
| CN | 103779319 | A | 5/2014 |
| CN | 103825101 | A | 5/2014 |
| CN | 104701304 | A | 6/2015 |
| CN | 104867912 | A | 8/2015 |
| CN | 105190998 | A | 12/2015 |
| CN | 107093598 | A | 8/2017 |

\* cited by examiner

Fig. 1B
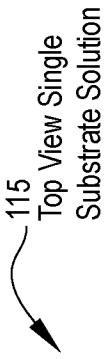
115
Top View Single
Substrate Solution
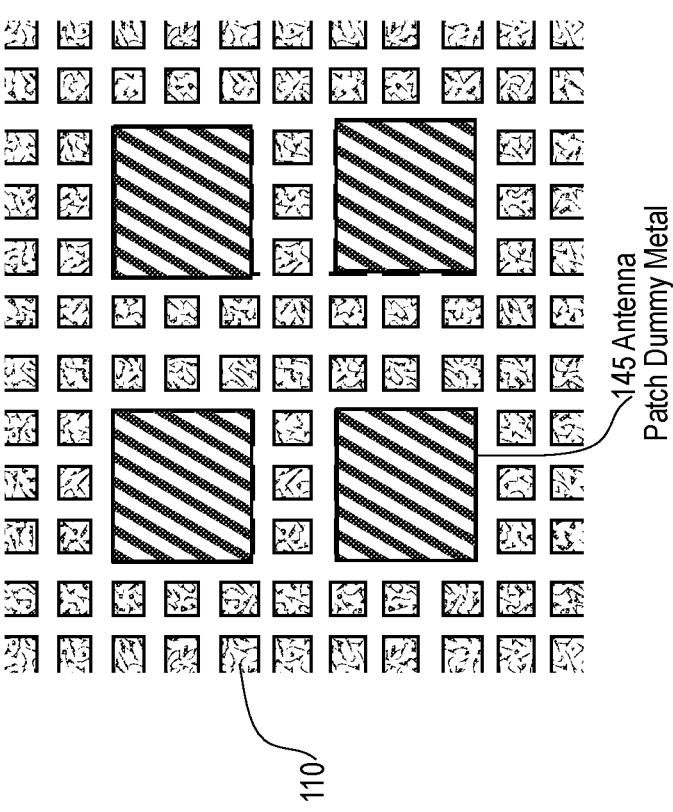
145 Antenna
Patch Dummy Metal
110

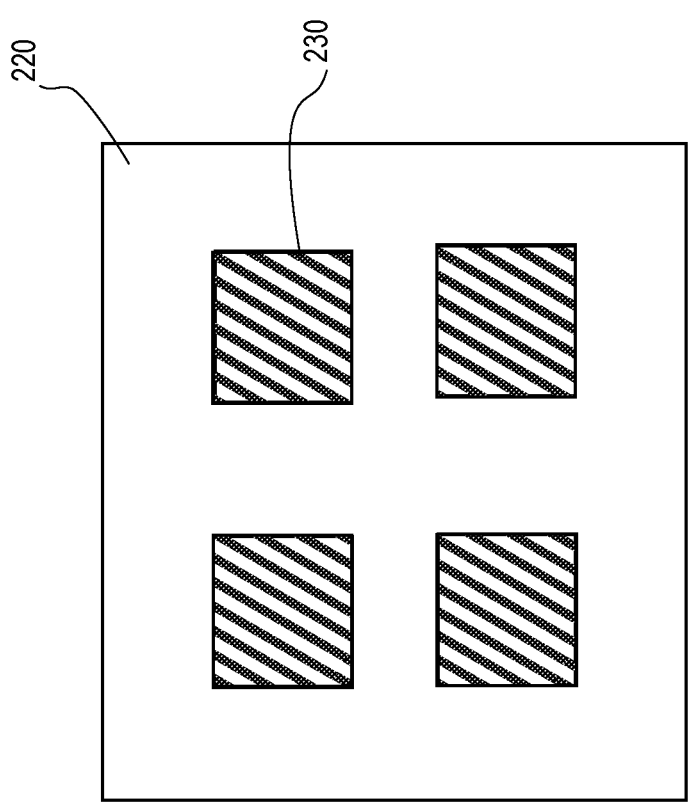
Fig. 2B

Fig. 4

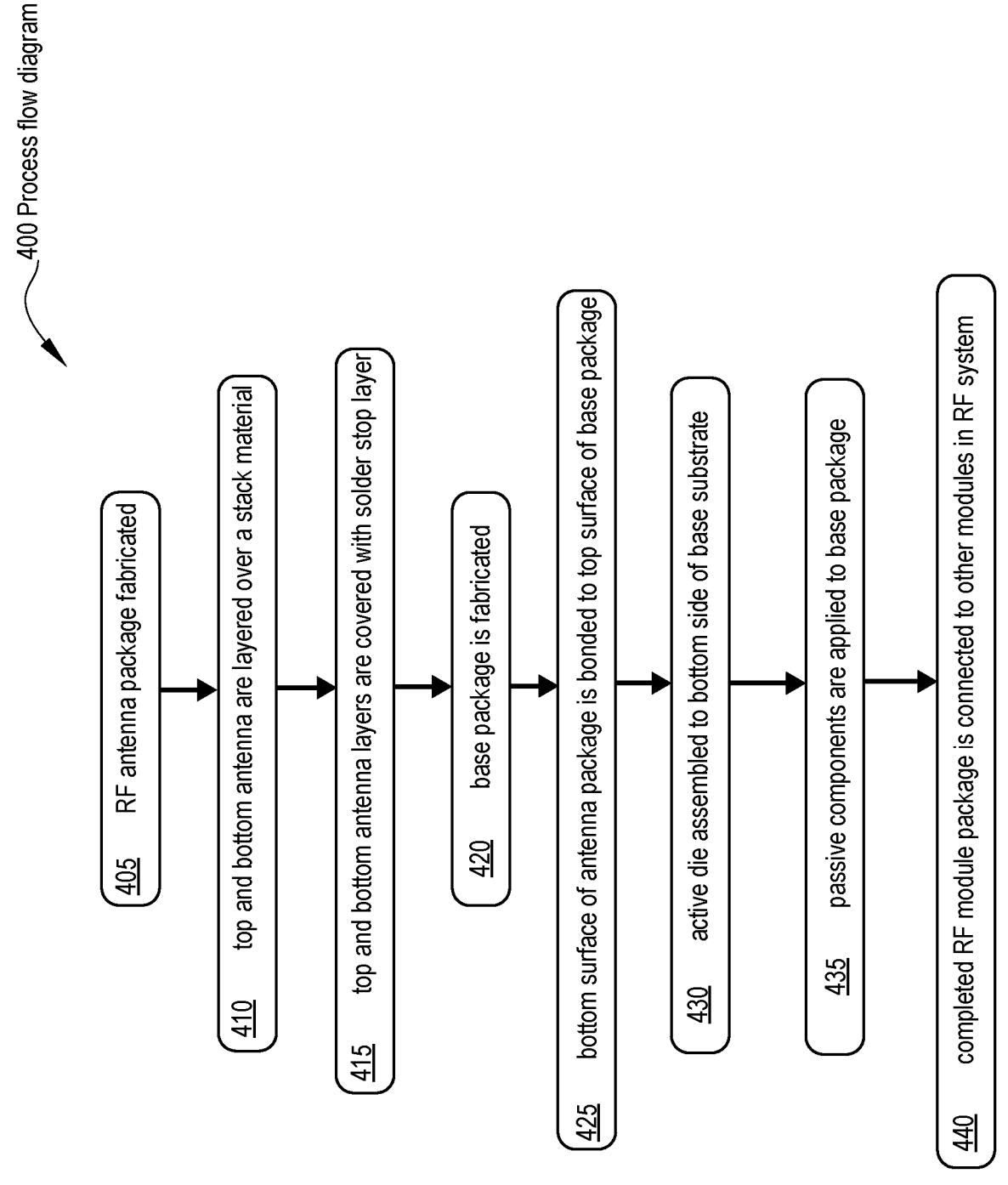

400 Process flow diagram

405   RF antenna package fabricated 410   top and bottom antenna are layered over a stack material 415   top and bottom antenna layers are covered with solder stop layer 420   base package is fabricated 425   bottom surface of antenna package is bonded to top surface of base package 430   active die assembled to bottom side of base substrate 435   passive components are applied to base package 440   completed RF module package is connected to other modules in RF system

ANTENNA PACKAGE USING BALL ATTACH ARRAY TO CONNECT ANTENNA AND BASE SUBSTRATES

CROSS-REFERENCE TO RELATED APPLICATIONS

This application is a divisional and claims the benefit of priority under 35 U.S.C. § 120 of U.S. application Ser. No. 17/705,182, filed Mar. 25, 2022, and entitled ANTENNA PACKAGE USING BALL ATTACH ARRAY TO CONNECT ANTENNA AND BASE SUBSTRATES, now U.S. Pat. No. 11,870,163, which is a continuation and claims the benefit of priority under 35 U.S.C. § 120 of U.S. application Ser. No. 16/635,148, filed Jan. 29, 2020, and entitled ANTENNA PACKAGE USING BALL ATTACH ARRAY TO CONNECT ANTENNA AND BASE SUBSTRATES, now U.S. Pat. No. 11,355,849, which application is a national stage application under 35 U.S.C. § 371 of PCT International Application Serial No. PCT/US2017/054395, filed on Sep. 29, 2017 and entitled ANTENNA PACKAGE USING BALL ATTACH ARRAY TO CONNECT ANTENNA AND BASE SUBSTRATES, all disclosures of which are hereby incorporated by reference herein in their entirety.

FIELD

The subject matter described herein relates generally to the field of semiconductor and electronics manufacturing, and more particularly, an antenna package using a ball attach array to connect an antenna and base substrates of the package.

BACKGROUND

In modern mobile computing systems, PCB area and volume reduction is becoming one of the most important drivers for technology innovation and is currently pushing semiconductor design and manufacturing companies to discover and develop innovative ideas to improve and increase integration levels.

Many mobile devices include antennas for communication on Wi-Fi and cellular networks. This requires that antennas and radio frequency (RF) circuitry be integrated into the device. In order to simplify fabrication and assembly, antennas for millimeter wave portable devices can be made from the same materials that are used for substrates in semiconductor chip packages. The substrates may be made of alternating layers of copper and glass impregnated resin such as FR-4.

While the materials and techniques are similar to those of package substrates, the dimensions and configurations are different. Antennas may become very hot when transmitting high power signals so that heat flow is more important. The dielectric layers must also be thick enough to isolate the antennas of each layer from each other.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also correspond to embodiments of the claimed subject matter.

BRIEF DESCRIPTION OF THE DRAWINGS

Embodiments are illustrated by way of example, and not by way of limitation, and will be more fully understood with reference to the following detailed description when considered in connection with the figures in which:

FIG. 1B is a top view diagram of a portion of the package of FIG. 1A according to an embodiment.

FIG. 2B is a top view diagram of a portion of the package of FIG. 2A according to an embodiment.

FIG. 4 is a process flow diagram of fabricating an RF module package according to an embodiment.

DETAILED DESCRIPTION

Figure 1A:
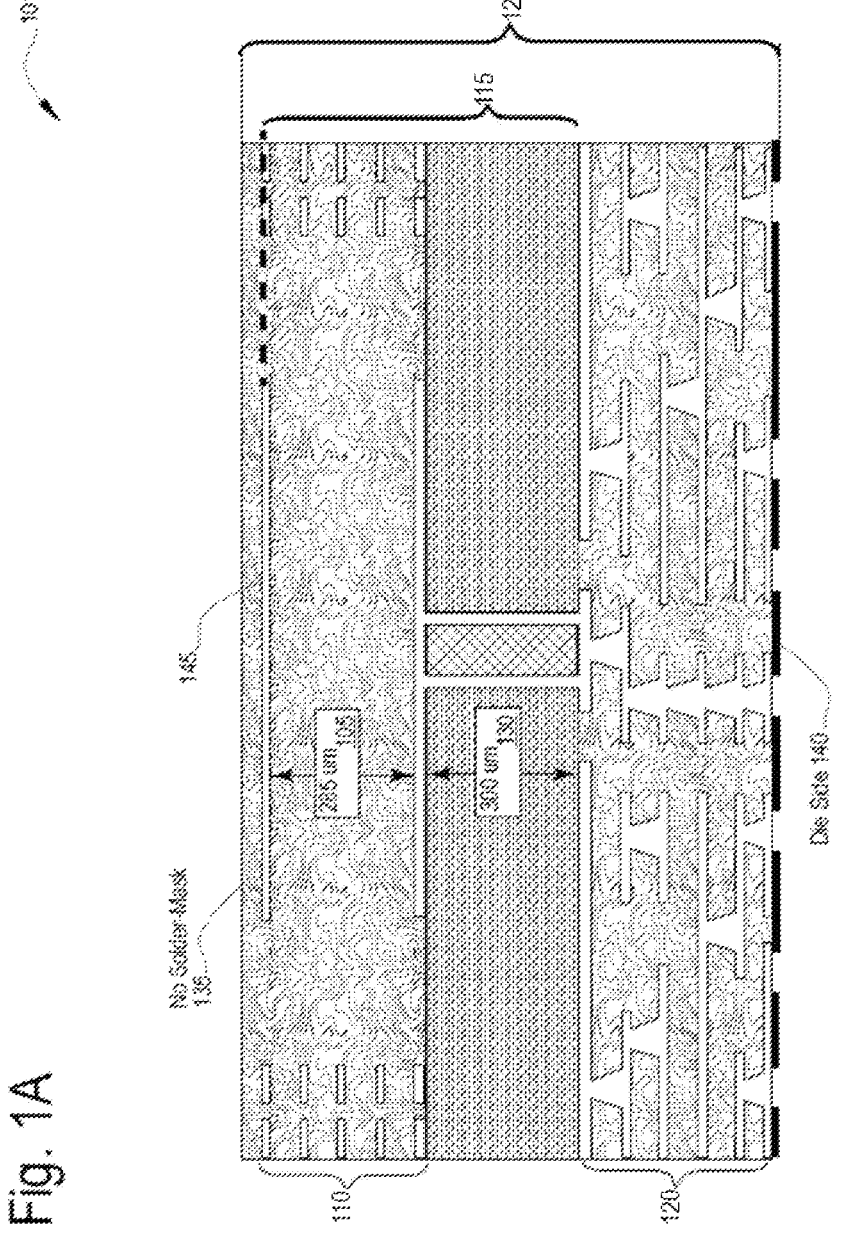
FIG. 1A is a cross-sectional side view diagram of a laminated antenna and package substrate combination according to an embodiment.

Described herein is an antenna package that uses a ball attach array to connect antenna and base substrates. The described semiconductor package construction reduces the assembly risk and improves the substrate fabrication yield. As described herein, the thick antenna layers for an antenna package may be made separately from other components. Assembly may then be used to connect the antenna portion to the rest to form a complete millimeter (mm) wave package with antenna array.

By fabricating the antenna array and the main package separately, each section's design will have fewer layers compared to the combined sections. Each section will also have a more symmetric structure, and balanced Cu density. The symmetry and balanced Cu density tends to minimize the warpage of each substrate section and simplifies the fabrication process. By separating the antenna fabrication process, different antenna designs may be made for attachment to the same main package. As an example, multiple antenna skews may be manufactured to suit different uses. The separate antenna package speeds up antenna packaging design optimization and allows more flexibility in antenna design and material selection to meet different customer specifications. Using similar die and routing may be used to drive different antenna designs, such as those targeted for different frequency ranges specific to a region such as 25-27 GHz EU, & 28+ GHz USA etc.

The emergence of 5th generation wireless systems (5G) is driving new substrate and packaging assembly technologies to provide cost effective and high performance solutions for mm wave (e.g. 20-110 GHz) antenna arrays. Driven by 5G frequency and bandwidth requirements, the antenna section of a mm wave 5G package normally has thick dielectric layers and imbalanced Cu density. While a package substrate has multiple densely packed copper layers with thin dielectric for the baseband voltages, the antenna portion has much less metal with much wider dielectric in between the layers. This results in high warpage of the combined 5G substrate, upon which the antenna is based. This dramatically increases assembly challenges and reduces substrate manufacturing yield. In some cases, dummy metal layers are used to balance out the Cu density, but this adds cost and complexity and may impact the RF performance of the antenna.

As described herein substrate warpage issues are solved by decoupling the substrate design and connecting each antenna section using ball attach array assembly technology. The antenna piece is decoupled from the 5G substrate to reduce the 5G substrate warpage and minimize packaging assembly risk. In embodiments, the substrate mainly contains routing, power, ground, passives, and die assembly footprints. The design and manufacturing of the antenna piece is decoupled from the design and manufacturing of the package substrate. The antenna portion is then re-connected to the 5G package with a connection process.

The decoupled package substrates have a lower layer count, a more symmetric stackup structure, and a more balanced Cu density. This leads to lower warpage of the package substrate in general as compared to a 5G package substrate with an integrated antenna. The decoupled antenna also allows for a quick antenna design upgrade without re-designing the fabrication of the entire 5G substrate. Electrically, the process for simulating an antenna package decoupled from a base package is more efficient and may therefore be more easily improved and augmented with new feature innovations. In other cases, it allows for the package substrate and the die layout to be redesigned without affecting the antennas.

A ball attach array, such as a ball grid array (BGA) is described as an example assembly technique to attach the antenna and the package together. A BGA connection brings more flexibility to the 5G packaging design and materials. Laminating disparate substrates together using typical panel manufacturing processes adds 200 µm or more of misalignment between the layers. This can be compensated for by growing the capture pad size, but too large a capture pad negatively impacts the RF performance of the antenna. In contrast, a ball attach approach self-aligns the two separate packages.

A ball attach configuration also allows different solder ball and solder paste combinations to be selected. This larger variety of possible materials enables lower melting temperature dielectrics. Copper core solder balls may be used to set a very uniform and thin gap between the layers and keep the RF performance consistent across the package interface.

The antenna package fabrication method described herein reduces substrate fabrication warpage issues, reduces the substrate manufacturing lead time and reduces manufacturing yield loss. It also helps simplify the antenna packaging design changes, and brings more flexibility to packaging design and materials. The BGA connection described herein may use multiple materials including but not limited to pure solder balls, low temperature solder balls (LTS), Cu cored solder balls, polymer cored solder balls, metal balls, dielectric coated solder balls, and solder balls with other types of cores. The solder paste may also be varied enabling a wider variety of assembly processes and allowing for an assembly thermal hierarchy. Alternatively, copper pillars may be used instead of the solder balls and electrically coupled to the two packages. The copper pillars also maintain a consistent spacing while also establishing a distance between the two packages.

FIG. 1A is a cross-sectional side view diagram of a laminated antenna and package substrate combination 101. A 5-2-5 package 125 has a stacked patch antenna 115 and a routing layer 120 that combines any desired routing features including PD (power/data), IO (Input/Output), and RF (Radio Frequency) routing. The antenna 145 has multiple conductive layers separated by an intermediate dielectric layer 105. These are separated from the routing layers 120 by a lower dielectric area 130 between the antenna elements and the routing layers. Horizontal vias through the lower dielectric area connect the antenna elements to the RF routing in the routing layer. The routing also has a die side 140 to which microelectronic dies are attached. These are then coupled through the routing layers 120 to the antenna 115 which is on a side of the die opposite the die side.

As shown, there are fewer conductive layers in the antenna 115 than in the routing 120. In order to balance the density of the metal layers of the antenna portion with the density of the metal layers in the antenna, dummy metal 110 is added to the antenna. The dummy metal does not carry any specific signals and is designed to control the capacitance, reactance, inductance, and other electrical characteristics of the antenna.

FIG. 1B is a top view diagram of a portion of the package of FIG. 1A. In this view, the antenna patches 145 are shown as square or rectangular metal pads. The dummy metal layers 110 are additional square or rectangular pads on all sides of the antenna patches. The dummy metal extends to the left, right, top, and bottom as shown in the diagram.

Figure 2A:
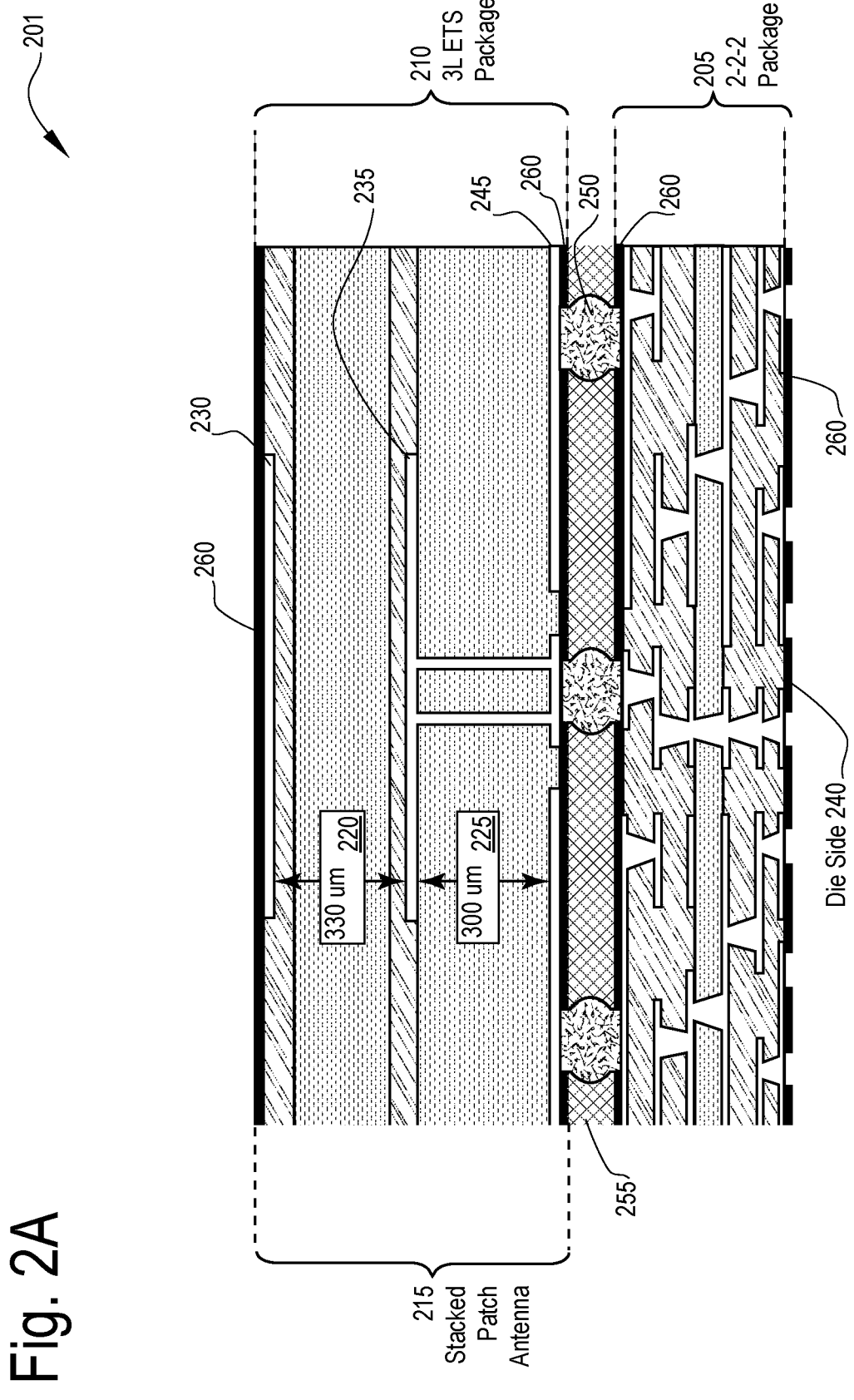
FIG. 2A is a cross-sectional side view diagram of an attached antenna and package substrate combination according to an embodiment.

FIG. 2A is a cross-sectional side view diagram of a combined antenna and package substrate 201 attached using a ball grid array. In this example, a stacked patch antenna 215, such as a 3L ETS (Three Layer Embedded Trace Substrate) package is attached to a 2-2-2 routing layer package 205. The routing layer package may include PD, IO, and RF like the routing layers of FIG. 1. The two packages are attached with some type of solder system, such as an array of solder balls 250.

The routing substrate 205 may be the same or different from that of FIG. 1A. As shown, the routing package is a base package for RF signals between an RF die attached to a die side 240 of the package 205 and an antenna attached to the opposite side of the package. The base package may take any of a variety of different forms and serve different functions. As shown, it may be considered to be a package or a carrier for an RFIC (Radio Frequency Integrated Circuit) for e.g. a mm wave frequency band. One or more IC's are embedded within the package or attached to the die side 240 or both. These have drivers and receiver ports coming out from connected dies that are then attached through the package to the antennas of the antenna package for transmitting and receiving purposes. In some embodiments, the base package serves three purposes. One purpose is as an RF link between an RFIC and the antenna. A second purpose is as a link to a power supply and a third purpose is as link to a ground plane as a reference. The base package has a solder stop layer 260 or other type of dielectric layer between pads or lands on the die side 240 on the bottom surface opposite the antenna. This allows various active microelectronic dies to be mounted to the pads or lands.

Various solder ball materials and sizes can be used to connect the antenna substrate 210 and base substrate 205 of the BGA connected antenna package 201 to meet different performance and cost considerations. These options allow for more substrate design flexibility as long as the RF performance is satisfied. As examples Cu cored solder balls may be used to provide a uniform solder ball stand height across the package. Pre-fabricated solder balls may be fabricated to a precise size so that the distance between the antenna package and the routing package is consistent across the solder joint. Low temperature solder balls or solder paste may be used to enable ball attach at lower temperatures. The lower temperature, e.g., about 130° C. may further reduce warping in the final assembly. The parts may be connected at lower temperatures where the metal layer expansion is less. In this example, there is a solder ball array 250 between the two packages and an underfill 255 to reduce impacts and protect the integrity of the electrical connection. The underfill is optional and may be formed of different materials. Alternatively, an air gap may be used between the two packages.

The antenna package 210 includes a stacked patch antenna 215 formed of three patterned layers with conductive antenna elements 230, 235, 245 and an intermediate dielectric layer 220, 225 between each patterned antenna. There may be two layers or there may be more than three layers depending on the particular RF specifications for each antenna. Additional types and sizes of antennas may also be formed in the antenna package 210. The antenna package is covered by a solder stop layer 260 on the top and bottom of the package or by any other suitable dielectric. The illustrated antenna is a stacked patch antenna for mm wave frequencies but it may be adapted to server other and additional purposes. While only horizontal antenna elements are shown, vertical elements and elements with other orientations may be used in addition or instead.

The base substrate has multiple horizontal layers of patterned conductive material and dielectric with vertical vias to connect the horizontal layers as appropriate. The base substrate is also covered with solder stop on a top surface. The top surface of the base substrate package is placed facing the bottom surface of the antenna package to connect the two packages together. The solder balls, pillars or other conductive structures are applied to gaps in the solder stop dielectric and the two parts are attached together by melting the solder. Copper filled solder balls allow the solder to melt while the copper remains solid to maintain a distance between the two packages. The distance is determined by the size of the copper between the two packages.

FIG. 2B is a top view diagram of a portion of the antenna package 215. This diagram shows the horizontal antenna elements surrounded by the dielectric 220. As shown, no dummy metal is required to prevent warping. The BGA connection 250 allows the packages to expand and contract a small amount without warping the complete package. The dielectric is carefully specified to have a suitable rigidity, thermal stability, and electrical and RF characteristics. The dielectric provides the stiffness and planarity to attach the antenna package to the base package since the antennas are thin conductive layers. The antenna structures are in the form of large planes which are formed to strict dimensional accuracy requirements.

FIG. 2A shows a single antenna package 210 mounted to the routing package 205. Vertical conductive posts or vias connect the planes of the antenna to the routing layer. For some embodiments, another antenna package may be mounted over the single antenna package. This antenna may also be connected with a BGA and vias through the first antenna package to the routing package. The additional antenna package may be used to support different frequencies, different modulation types or multiple input/output systems. Further antenna packages may be added as desired to provide different or additional antenna configurations.

Figure 3A:
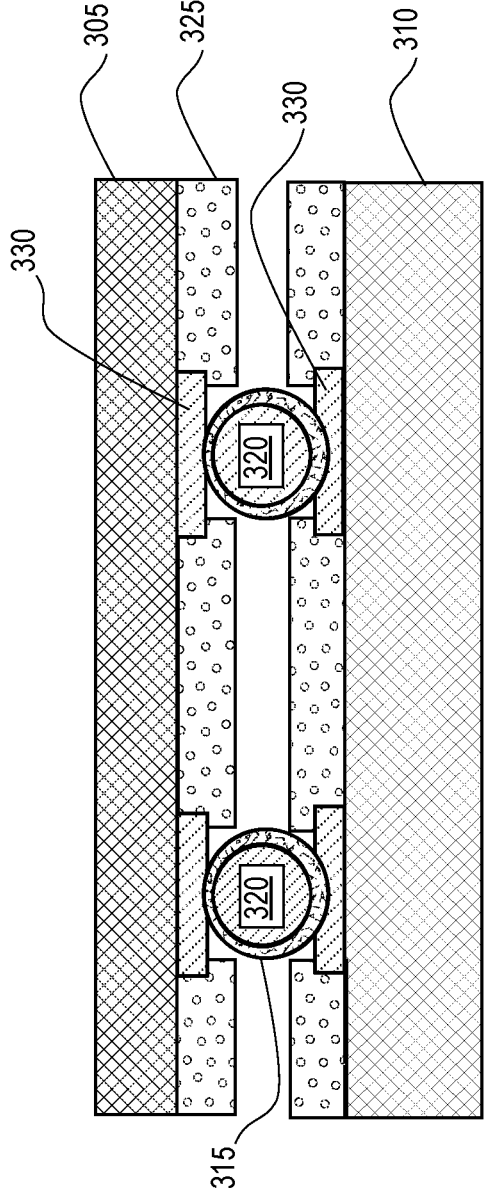
FIG. 3A is an enlarged cross-sectional side view diagram of a portion of a BGA connection according to an embodiment.

FIG. 3A is an enlarged cross-sectional side view diagram of a portion of a BGA connection suitable for use with the present application. An antenna package 305 is bonded to a base package 310 using a cored BGA connection 315. Each solder ball has a solid core 320 and maintains its shape. The solder balls attach to lands or pads 330 on the respective packages and are isolated from each other by a solder stop layer 325.

Figure 3B:
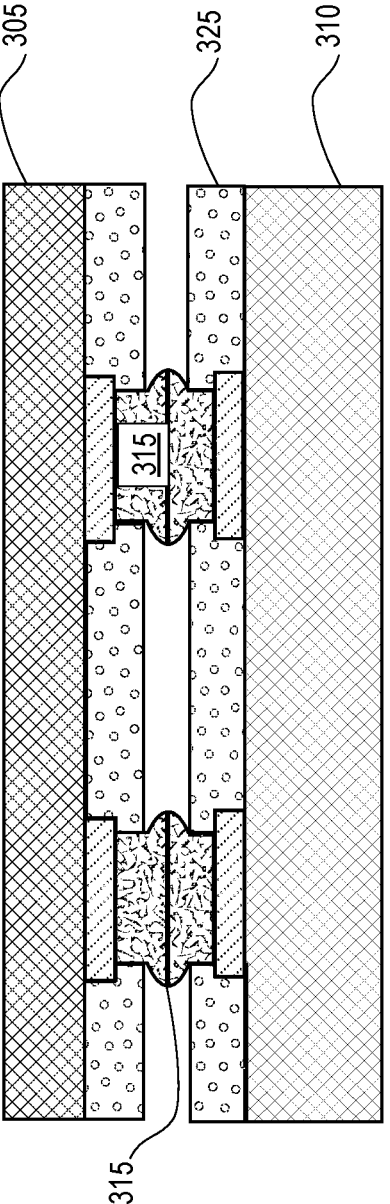
FIG. 3B is an enlarged cross-sectional side view diagram of a portion of an alternative BGA connection according to an embodiment.

FIG. 3B shows a similar cross-sectional side view diagram in which the antenna package 305 and the base package 310 are connected by a ball grid attachment 315. In this case the solder balls are reflowed to form a solder connection with no solid core. A solder stop layer 325 or other dielectric layer isolates each solder ball from the patterned conductive layers associated with the conductive pads or lands. An underfill (not shown) may be added to either of the solder ball configurations, depending on the implementation and expected use of the packaged combination.

FIG. 4 is a process flow diagram to describe a method 400 of fabricating an RF module package. At 405 an RF antenna package is fabricated by layering a stack material that is to be between a top and a bottom antenna layer to form multiple antenna plane surfaces. At 410 the top and bottom antenna are layered over a stack material to form multiple antenna plane surfaces. More than two antenna plane surfaces may be formed to suit particular implementations. At 415 the top and bottom antenna layers are covered with a solder stop layer. Many more antenna layers may be formed to complete the RF antenna package, such as a mm wave antenna package. The stack material between the antenna layers has a top and a bottom planar surface to support the antenna layers and the stack material is dielectric to electrically isolate the top and the bottom antenna layers from each other.

At 420 the base package is fabricated by plating a core material and building alternating patterned conductive and dielectric layers to create RF links, power links, and a ground plane to connect to the antenna layers. As an example, the base package may be fabricated by patterning a copper layer over opposite sides of a core material, laminating a dielectric over the patterned copper layers, patterning a second copper layer over both of the dielectric layers and repeating laminating a dielectric and patterning copper to build up multiple patterned copper layers on both sides of the core material. Alternatively, a coreless substrate may be formed by patterning layers over a temporary carrier.

At 425 a bottom surface of the antenna package is bonded to a top surface of the base package to form the RF module package. The bonding may be done in different ways, including by using a ball grid array between the antenna package and the base package.

A ball grid array may be made by applying an array of solder balls to the top surface of the base package, applying an underfill between the solder balls, pressing the antenna package against the base package and reflowing the solder of the solder balls. In some cases, a solder stop layer is applied on the bottom surface of the antenna package and on the top surface of the base package before applying the solder balls. Different types of solder balls may be used including solid solder, copper core solder, copper pillars with solder, etc.

The connecting together through the BGA completes the RF module package. However other process may be done. At 430 an active die is optionally assembled to a bottom side of the base substrate. At 435 passive components are optionally applied to the base package. At 440 the completed RF module package is optionally connected to other modules in an RF system either through a printed circuit board or a cable.

Figure 5:
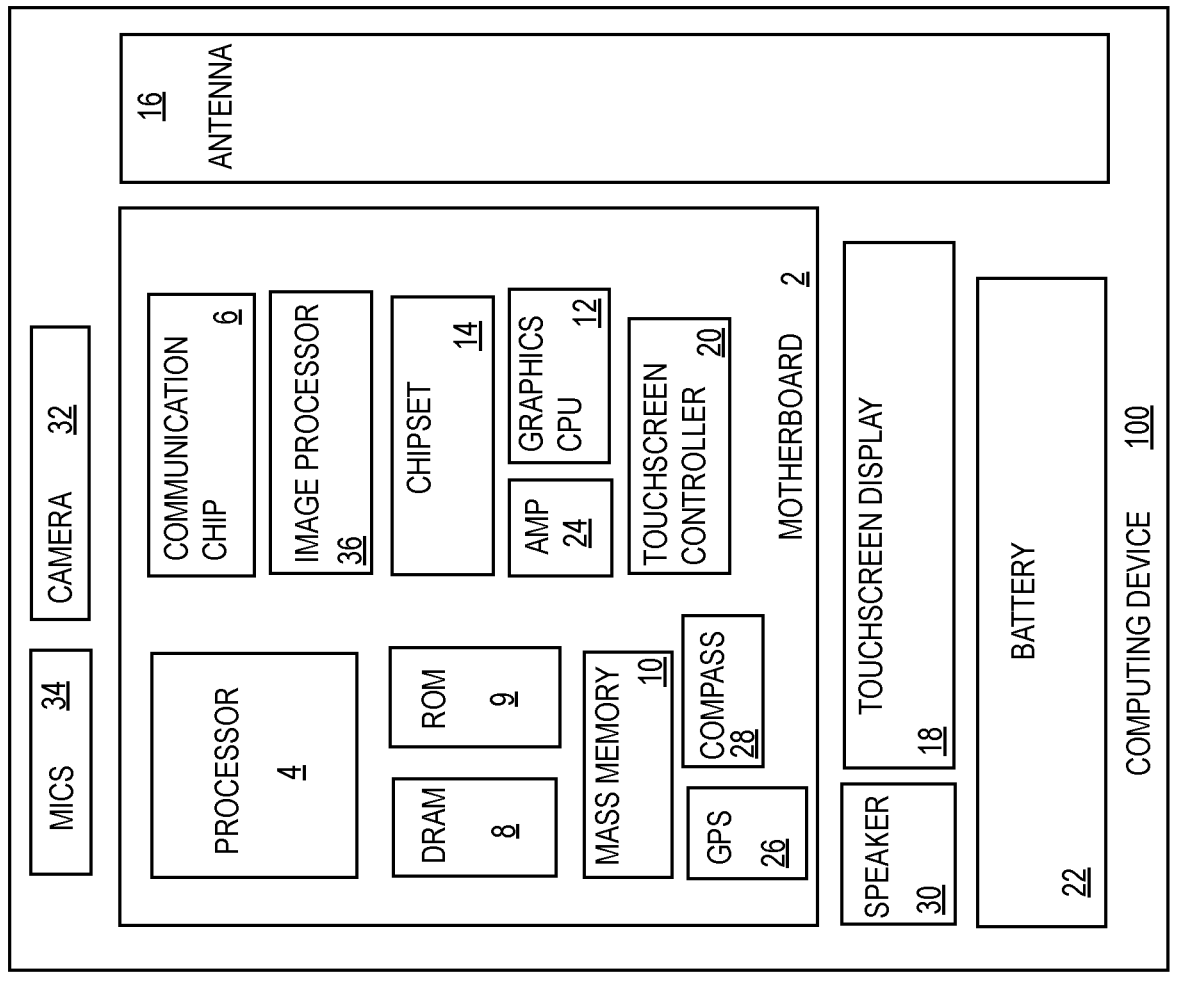
FIG. 5 is a block diagram of a computing device with antenna packages on a system board according to an embodiment.

FIG. 5 is a block diagram of a computing device 100 with antenna packages in accordance with one implementation. The computing device 100 houses a system board 2. The board 2 may include a number of components, including but not limited to a processor 4 and at least one communication package 6. The communication package is coupled to one or more antennas 16. The processor 4 is physically and electrically coupled to the board 2.

Depending on its applications, computing device 100 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, cameras 32, a microphone array 34, and a mass storage device (such as hard disk drive) 10, compact disk (CD) (not shown), digital versatile disk (DVD) (not shown), and so forth). These components may be connected to the system board 2, mounted to the system board, or combined with any of the other components.

The communication package 6 enables wireless and/or wired communications for the transfer of data to and from the computing device 100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication package 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 100 may include a plurality of communication packages 6. For instance, a first communication package 6 may be dedicated to shorter range wireless communications such as Wi-Fi and Bluetooth and a second communication package 6 may be dedicated to longer range wireless communications such as GPS, EDGE, GPRS, CDMA, WiMAX, LTE, Ev-DO, and others.

The communication chip 6 and antenna 16 may be combined and configured as shown in the above figures using stacked packages with an attachment array between them and then coupled to the other system components. The coupling may be through the motherboard as shown, through cabling or in other ways. Alternatively, or in addition, additional packages such as one of the DRAM, ROM, image processor, graphics processor, communications, or sensors may be stacked together with the base substrate and the antenna substrate and then mounted to the system board 2. While the examples are directed to two stacked packages, other combinations may be used.

In various implementations, the computing device 100 may be a laptop, a netbook, a notebook, an ultrabook, a smartphone, a tablet, a personal digital assistant (PDA), an ultra mobile PC, a mobile phone, a desktop computer, a server, a set-top box, an entertainment control unit, a digital camera, a portable music player, or a digital video recorder. The computing device may be fixed, portable, or wearable.

In further implementations, the computing device 100 may be any other electronic device that processes data or records data for processing elsewhere.

In the present description, numerous specific details are set forth such as examples of specific systems, languages, components, etc., in order to provide a thorough understanding of the various embodiments. It will be apparent, however, to one skilled in the art that these specific details need not be employed to practice the embodiments disclosed herein. In other instances, well known materials or methods have not been described in detail in order to avoid unnecessarily obscuring the disclosed embodiments.

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

In addition to various hardware components depicted in the figures and described herein, embodiments further include various operations which are described herein. The operations described in accordance with such embodiments may be performed by hardware components or may be embodied in machine-executable instructions, which may be used to cause a general-purpose or special-purpose processor programmed with the instructions to perform the operations. Alternatively, the operations may be performed by a combination of hardware and software.

Any of the disclosed embodiments may be used alone or together with one another in any combination. Although various embodiments may have been partially motivated by deficiencies with conventional techniques and approaches, some of which are described or alluded to within the specification, the embodiments need not necessarily address or solve any of these deficiencies, but rather, may address only some of the deficiencies, address none of the deficiencies, or be directed toward different deficiencies and problems which are not directly discussed.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

While the subject matter disclosed herein has been described by way of example and in terms of the specific embodiments, it is to be understood that the claimed embodiments are not limited to the explicitly enumerated embodiments disclosed. To the contrary, the disclosure is intended to cover various modifications and similar arrangements as would be apparent to those skilled in the art. Therefore, the scope of the appended claims should be accorded the broadest interpretation so as to encompass all such modifications and similar arrangements. It is to be understood that the above description is intended to be illustrative, and not restrictive. Many other embodiments will be apparent to those of skill in the art upon reading and understanding the above description. The scope of the disclosed subject matter is therefore to be determined in reference to the appended claims, along with the full scope of equivalents to which such claims are entitled.

The following examples pertain to further embodiments. The various features of the different embodiments may be variously combined with some features included and others excluded to suit a variety of different applications. Some embodiments pertain to a method of fabricating an RF module package that includes fabricating an RF antenna package by layering a stack material in between a top and a bottom antenna layer to form multiple antenna plane surfaces, fabricating a base package by plating a core material and building alternating patterned conductive and dielectric layers to create RF links, power links, and a ground plane to connect to the antenna layers, and bonding a bottom surface of the antenna package to a top surface of the base package to form the RF module package.

In further embodiments bonding comprises bonding using a ball grid array between the antenna package and the base package.

Further embodiments include applying an array of solder balls to the top surface of the base package, applying an underfill between the solder balls, pressing the antenna package against the base package and reflowing the solder of the solder balls.

Further embodiments include patterning a solder stop layer on the bottom surface of the antenna package and on the top surface of the base package before applying the solder balls.

In further embodiments the solder balls are copper core solder balls.

In further embodiments the stack material between the antenna layers has a top and a bottom planar surface to support the antenna layers and wherein the stack material is dielectric to electrically isolate the top and the bottom antenna layers from each other.

In further embodiments fabricating an RF antenna package comprises layering a top and bottom antenna layer over a stack material to form multiple antenna plane surfaces and covering the top and bottom antenna layers with a solder stop layer.

In further embodiments fabricating a base package comprises patterning a copper layer over opposite sides of a core material, laminating a dielectric over the patterned copper layers, patterning a second copper layer over both of the dielectric layers and repeating laminating a dielectric and patterning copper to build up multiple patterned copper layers on both sides of the core material.

In further embodiments the antenna plane surfaces form a millimeter wave antenna.

Further embodiments include assembling an active die to a bottom side of the base substrate, applying passive components to the base package and connecting the RF module package other modules in an RF system either through a printed circuit board or a cable.

Some embodiments pertain to an RF module package including an RF antenna package having a stack material in between a top and a bottom antenna layer to form multiple antenna plane surfaces, a base package having alternating patterned conductive and dielectric layers to form routing through the base package, and a bond between a bottom surface of the antenna package and to a top surface of the base package.

In further embodiments the bond comprises a ball grid array between the antenna package and the base package.

In further embodiments the ball grid array comprises an array of reflowed solder balls on the top surface of the base package and an underfill between the solder balls.

Further embodiments include a patterned solder stop layer on the bottom surface of the antenna package and on the top surface of the base package between the solder balls.

In further embodiments the solder balls are copper core solder balls.

In further embodiments the stack material between the antenna layers has a top and a bottom planar surface to support the antenna layers and wherein the stack material is dielectric to electrically isolate the top and the bottom antenna layers from each other.

In further embodiments the antenna plane surfaces form a millimeter wave antenna.

Further embodiments include an active die assembled to a bottom side of the base substrate, passive components applied to the base package and a connection to other modules in an RF system.

Some embodiments pertain to computing system that includes a system board, a processor attached to the system board, and an RF module package including an RF antenna package having a stack material in between a top and a bottom antenna layer to form multiple antenna plane surfaces, a base package having alternating patterned conductive and dielectric layers to form routing through the base package, and a bond between a bottom surface of the antenna package and to a top surface of the base package.

In further embodiments the bond comprises a ball grid array between the antenna package and the base package having an array of reflowed solder balls on the top surface of the base package and an underfill between the solder balls.

In further embodiments the stack material between the antenna layers has a top and a bottom planar surface to support the antenna layers and wherein the stack material is dielectric to electrically isolate the top and the bottom antenna layers from each other.

The invention claimed is:

1. An electronic assembly, comprising:

an antenna package comprising multiple antenna plane surfaces, wherein the multiple antenna plane surfaces include a stack material in between a top and a bottom antenna layer;

a base substrate comprising multiple horizontal layers comprising a dielectric material, wherein individual horizontal layers include layers of patterned conductive material; and a bond between a bottom surface of the antenna package and a top surface of the base substrate.

2. The electronic assembly of claim 1, wherein the bond comprises a ball grid array between the antenna package and the base substrate.

3. The electronic assembly of claim 2, wherein the ball grid array comprises an array of solder balls on the top surface of the base substrate and an underfill between the solder balls.

4. The electronic assembly of claim 3, further comprising a patterned solder stop layer on the bottom surface of the antenna package and on the top surface of the base substrate between the solder balls.

5. The electronic assembly of claim 2, wherein the ball grid array includes an array of solder balls, and wherein the solder balls include copper.

6. The electronic assembly of claim 1, wherein the dielectric material is a first dielectric material, and the stack material is a second dielectric material.

7. The electronic assembly of claim 1, wherein the antenna plane surfaces form a millimeter wave antenna.

8. The electronic assembly of claim 1, wherein the electronic assembly is a radio frequency (RF) module.

9. The electronic assembly of claim 1, further comprising a communication chip coupled to the antenna package.

10. The electronic assembly of claim 9, further comprising a system board and a processor, wherein the processor is coupled to the system board and the communication chip is coupled to the system board.

11. A communication device, comprising:
an electronic assembly; and
a circuit board coupled to the electronic assembly,
wherein the electronic assembly includes:
a radio frequency (RF) antenna package comprising antenna patches in multiple antenna layers, and further comprising a first dielectric material separating an antenna patch in a top antenna layer of the multiple antenna layers and an antenna patch in a bottom antenna layer of the multiple antenna layers,
package substrate comprising:
a second dielectric material,
a plurality of layers extending through the second dielectric material and being parallel to the antenna patches, wherein the plurality of layers include conductive traces embedded in the second dielectric material, and
conductive vias extending in a direction perpendicular to the antenna patches between two or more layers of the plurality of layers, and a bond between a bottom surface of the RF antenna package and a top surface of the package substrate.

12. The communication device of claim 11, further comprising:
a housing, wherein the electronic assembly and the circuit board are in the housing; and
cameras in the housing.

13. The communication device of claim 11, wherein a footprint of the antenna patch in the top antenna layer of the multiple antenna layers at least partially overlaps with a footprint of the antenna patch in the bottom antenna layer of the multiple antenna layers.

14. The communication device of claim 11, wherein the antenna patch in the top antenna layer of the multiple antenna layers is stacked above the antenna patch in the bottom antenna layer of the multiple antenna layers.

15. A method of fabricating an electronic assembly, the method comprising:
providing an antenna package comprising antenna patches in a plurality of antenna layers and a first dielectric material between a top antenna layer of the plurality of antenna layers and a bottom antenna layer of the plurality of antenna layers;
providing a base substrate comprising horizontal layers of a second dielectric material, wherein two or more of the horizontal layers include sub-layers comprising conductive material; and
providing a bond between a surface of the antenna package and a surface of the base substrate.

16. The method of claim 15, wherein the bond includes a ball grid array between the antenna package and the base substrate.

17. The method of claim 16, wherein the ball grid array includes an array of solder balls on the top surface of the base substrate and an underfill between the solder balls.

18. The method of claim 17, further comprising:
providing a patterned solder stop layer on the surface of the antenna package and on the surface of the base substrate between the solder balls.

19. The method of claim 16, wherein the ball grid array includes an array of solder balls, and wherein the solder balls include copper.

20. The method of claim 15, wherein the electronic assembly is a radio frequency (RF) module.

* * * * *